United States Patent [19]
Banerji et al.

[11] Patent Number: 5,573,602
[45] Date of Patent: Nov. 12, 1996

[54] SOLDER PASTE

[75] Inventors: Kingshuk Banerji; Edwin L. Bradley, III, both of Plantation, Fla.

[73] Assignee: Motorola, Inc., Schaumburg, Ill.

[21] Appl. No.: 358,489

[22] Filed: Dec. 19, 1994

[51] Int. Cl.$^6$ .................................................. B23K 35/34
[52] U.S. Cl. .......................... 148/24; 228/248.1; 428/570
[58] Field of Search ........................ 420/559; 148/23–26; 428/570; 228/248.1

[56] References Cited

U.S. PATENT DOCUMENTS

| | | | |
|---|---|---|---|
| 4,097,266 | 6/1978 | Takshashi et al. | 75/0.5 R |
| 4,731,130 | 3/1988 | O'Leary | 148/24 |
| 5,086,966 | 2/1992 | Melton et al. | 428/643 |
| 5,154,341 | 10/1992 | Melton et al. | 228/180.2 |
| 5,229,070 | 7/1993 | Melton et al. | 420/557 |
| 5,233,504 | 8/1993 | Melton et al. | 361/760 |
| 5,328,521 | 7/1994 | Kevsseyan | 148/24 |
| 5,382,300 | 1/1995 | Blonder | 148/24 |
| 5,389,160 | 2/1995 | Melton et al. | 420/562 |
| 5,427,865 | 6/1995 | Mullen, III | 428/559 |

*Primary Examiner*—Melvyn Andrews
*Attorney, Agent, or Firm*—Dale W. Dorinski

[57] ABSTRACT

A solder paste is made from solder powder having two different alloys. The individual particles in the solder powder consist of a low melting solder coating (115) that surrounds a nucleus (120) of a higher melting solder. The low melting solder is compositionally distinct from the higher melting solder. The particles are suspended in a matrix of a solder paste vehicle, which may also contain a fluxing agent. In one embodiment of the invention, the low melting solder is an alloy of 43% tin, 43% lead and 14% bismuth, and the higher melting solder is an alloy of 52% tin, and 48% bismuth.

20 Claims, 1 Drawing Sheet

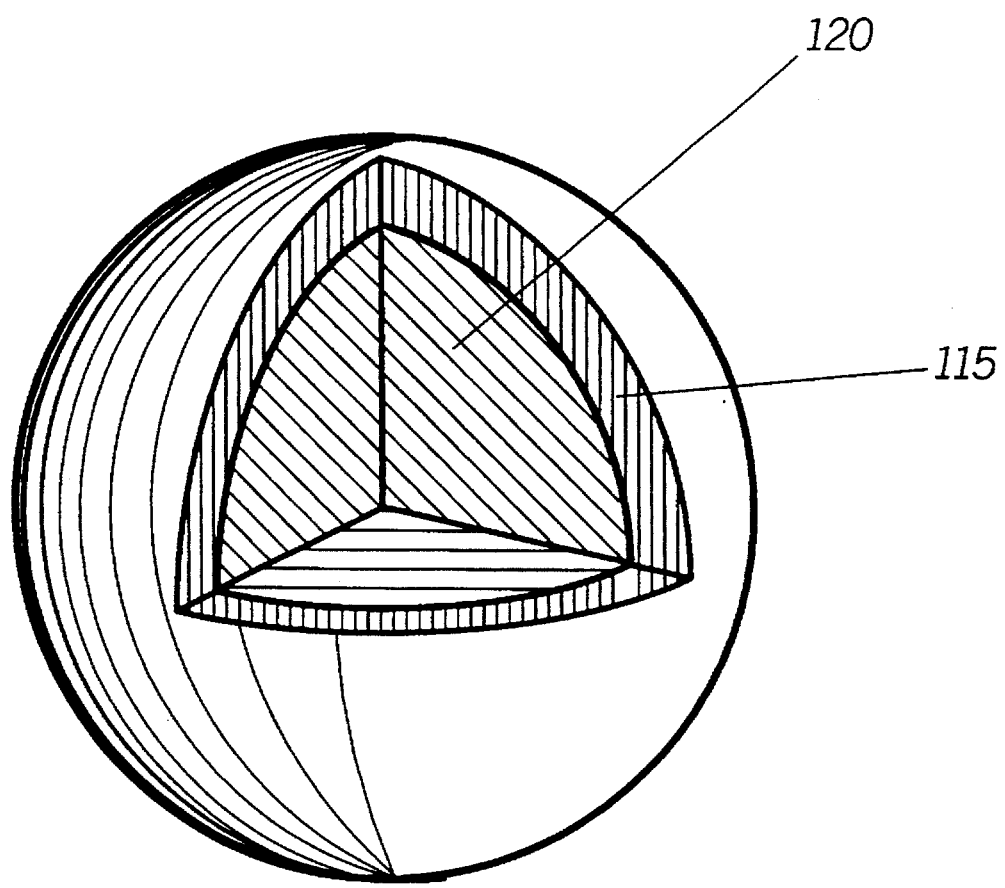

SOLDER PASTE

CROSS REFERENCE TO RELATED APPLICATIONS

This application is related to U.S. application Ser. No. 08/236,611, now U.S. Pat. No. 5540379 entitled "Soldering Process" by Vahid Kazem-Goudarzi, Henry F. Liebman, Kingshuk Banerji, William B. Mullen, III, and Edwin L. Bradley, III, and to U.S. patent application Ser. No. 08/236, 615 now U.S. Pat. No. 5415944 entitled "Solder Clad Substrate," by Vahid Kazem-Goudarzi, Edwin L. Bradley, III, Kingshuk Banerji, and Henry F. Liebman, both assigned to Motorola, Inc.

TECHNICAL FIELD

This invention relates in general to solder pastes, and more particularly to a solder pastes utilizing multiple solder alloys.

BACKGROUND

Solder pastes are employed to form a solder joint, for example, in physically and electrically connecting components of a microelectronic package. A typical solder paste comprises a powder formed of a solder alloy which is dispersed in a liquid vehicle that contains a flux. One advantage of the paste is that it may be conveniently applied to the solderable surfaces of a printed circuit board (PCB), for example, by screen printing. The PCB is heated to melt the solder powder, whereupon the molten solder coalesces to form a liquid body sufficient to complete the connection. In order to obtain a strong bond, it is essential that the molten alloy flow in intimate contact onto the solderable surfaces, which phenomenon is referred to as wetting. Wetting is enhanced by the flux, which reacts to remove oxides from the metal surfaces. In a typical soldering step, fluxing occurs during the early stages of heating, so that the molten solder may readily wet the surfaces of interest. Nevertheless, the time for heating must necessarily be sufficient to not only melt the solder powder, but also to permit fluxing and wetting to be completed. Common solder paste typically includes a powder composed of a tin-lead alloy. During heating, the tin-lead alloy forms a liquid at about 183° C. In order to accelerate heat transfer to the solder powder and thereby minimize the time at the elevated temperature, the assembly is typically exposed to an oven temperature that is as much as 40° to 60° C. above the solder melting point. This overheating significantly above the melting point tends to adversely affect electronic components. In order to avoid this, some have used solders of an indium-tin or bismuth-tin alloy to take advantage of low melting eutectic phases. However, such low temperature solder is not adequate to withstand operating temperatures experienced during many microelectronic applications. Thus, there is a need for a solder paste that permits soldering to be completed at a temperature suitable to avoid damage to microelectronic components, that minimizes the time required to melt the solder paste and wet the contact surfaces, and that provides a reliable solder joint for use at higher operating temperatures of modern day microelectronic packages.

SUMMARY OF THE INVENTION

Briefly, according to the invention, a solder paste is made from solder powder having two different alloys. The individual particles in the solder powder consist of a low melting solder coating that surrounds a nucleus of a higher melting solder. The low melting solder is compositionally distinct from the higher melting solder. The particles are suspended in a matrix of a solder paste vehicle, which may also contain a fluxing agent.

In one embodiment of the invention, the low melting solder is an alloy of 43% tin, 43% lead and 14% bismuth. In another embodiment, the higher melting solder is an alloy of 52% tin, and 48% bismuth.

BRIEF DESCRIPTION OF THE DRAWING

The figure is a partial cut-away isometric view of a solder particle for use in a solder paste in accordance with the invention.

DETAILED DESCRIPTION OF THE PREFERRED EMBODIMENT

Most solders are alloys of tin and lead. Pure lead melts at 327° C. and pure tin melts at 232° C. When these two metals are alloyed, the alloy has a lower melting point than either of the individual components. Depending upon the percentage composition of the tin and lead, the melting point will vary. However, there is one alloy having a composition of 63% tin and 37% lead, known as the eutectic composition, that has the lowest melting point (183° C.) of any of the possible mixtures. This eutectic composition has the characteristic of having a sharp and distinct melting point precisely at this temperature. That is, the solder alloy undergoes a phase change from solid to liquid at this point. All other compositions of tin and lead, other than the eutectic, are mixtures which do not melt sharply at any one temperature, but which pass through an intermediate range of plasticity in cooling from the liquid to the solid state.

These various alloys that pass through an intermediate range of plasticity are said to have a melting range. At temperatures above the melting range, the alloy is a liquid, and below the melting range, the alloy is a solid. However, at temperatures within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the alloy is a solid, and at temperatures above the liquidus temperature, the alloy is a liquid. Materials other than tin and lead may be used to form solder alloys, and will behave similarly. Examples of such materials are antimony, arsenic, bismuth, cadmium, indium, and silver. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

While the specification concludes with claims defining the features of the invention that are regarded as novel, it is believed that the invention will be better understood from a consideration of the following description in conjunction with the drawing figure. This invention provides a solder paste which utilizes two compositionally different solders. However, unlike other prior art solder pastes, such as U.S. Pat. No. 5,229,070 which uses a mixture of two different kinds of conventional solder powders, this invention uses a unique type of a single solder powder. The powder is made from individual particles containing at least two different solders or solder alloys. (A mass of particles is frequently referred to as 'solder powder'.) Each of the alloys has a melting point or range that is unique from the other. In a preferred embodiment of the invention, the solder particles consist of a central core or nucleus 120 of a tin-lead-silver alloy (melting point 179°–181° C.), which is surrounded by a coating 115 of a tin-lead-bismuth alloy having a melting range of about 144° C.–163° C. The center core 120 accounts for about 88 weight % of the total mass of each individual particle, with the outer coating accounting for the remaining 12%. The tin-lead-silver alloy is about 62% tin, 36% lead, and 2% silver, whereas the tin-lead-bismuth alloy is about 43% tin, 43% lead, and 14% bismuth. The solder particles are in the form of spheres or irregularly shaped particles, typically in the size range of 200–500 mesh. The tin-lead-bismuth solder alloy is referred to as the low temperature alloy, and the tin-lead-silver alloy is referred to as the high temperature alloy, since its melting range is above the other alloy. Although the preferred embodiment employs particles made from two solder alloys, three or more distinct alloys, for example, could be coated one upon another and still be considered to be within the spirit and scope of the invention. In addition, the ratios or amounts of each alloy could also be modified depending on the metallurgical composition of each material, or pure forms of metal could be used instead of alloys. In other embodiments, alloys of elements such as tin, lead, bismuth, indium, antimony, cadmium, arsenic, aluminum, gallium, gold, or silver can also be used. The concentric coating 115 on the center core 120 of the solder particles can be made in several ways, one of which is a modification of that disclosed in U.S. Pat. No. 4,097,266, which is incorporated herein by reference. Rather than using a central core of a very high melting metal such as copper, the solder particles are coated by starting with much different material, an alloy of solder such as the eutectic tin/lead solder. Other ways of coating the center core are by barrel plating, evaporation, or electroless plating.

A paste in accordance with this invention is formulated by blending the dual alloy solder particles with a vehicle (solvents such as high boiling alcohols and glycols) and a fluxing agent (white rosin, ethoxylated amides or fatty acids). The particular methods of blending and particular formulations of solder paste vehicles and fluxes are numerous and well known to those skilled in the art of solder pastes, and need not be elaborated upon herein.

One use for this type of solder paste is to create a PCB having a solder clad surface (also known as Solid Solder Deposition or SSD) on the solder pads. When the dual-alloy solder paste is initially reflowed after printing on the PCB, it is heated to a temperature such that the coating 115 of low temperature solder is melted or liquefied, but the high temperature solder in the center core or nucleus 120 remains in its original and unmelted state. During this step, the vehicle vaporizes, and the flux activates to remove oxide contamination from the surfaces of the PCB and the solder powder. In the preferred embodiment the peak reflow temperature would be about 160° C. At this temperature, only the coasting 115 of low temperature solder liquefies, while the nucleus 120 of higher temperature solder remains intact. This creates a structure where the individual solder particles no longer are discreetly identifiable, but are joined together as a single unit by the reflowed low temperature solder. Depending on the particular alloys selected, the resulting structure may consists of an aggregate-like structure of the unreflowed nuclei of the high temperature solder distributed within a matrix of the reflowed or melted low temperature solder. The low temperature solder serves to 'bind' the unmelted high temperature solder nuclei together to form a single mass. In practice, some voids or empty spaces may be formed in the solder mass upon cooling. These voids are the result of inefficiencies in the packing of the solder particles and/or the volatiles evolved from the flux and vehicle during the heating process. It is postulated that the low temperature material has wet to the PCB and to the high temperature solder material, alloying to form a metallurgical bond, thereby adding to the mechanical integrity of the resulting solder mass. The formation of a metallurgical bond is thought to occur by diffusion between the molten metal alloy and the solid metal during reflow.

When further operations are to be performed, for example, an assembly process where components are surface mounted to the PCB, the reflowed paste is fluxed and the surface-mount components are placed at the desired locations with the solderable portions of the parts in contact with the reflowed solder paste on the PCB. Prior to placement of the parts on the circuit board, additional solder flux or tacking agent may optionally be used. The assembly is now reflowed at a temperature sufficient to reflow both the low temperature solder and the high temperature solder. This forms a solder fillet between the solderable portions of the component and the PCB. As the temperature passes above 144° C., the low temperature alloy melts and as the temperature exceeds 180° C., the high temperature alloy also melts. The two liquid alloys typically blend to form a third alloy that is compositionally distinct from the other two. This produces a liquid phase of uniform composition, which, when sufficiently cooled, solidifies to form the desired joint bonding the PCB to the component.

Alternate embodiments of the invention find the use of a central core of eutectic tin/lead solder having a predetermined solidus temperature of about 183° C. The central core is enveloped by a low melting alloy of 52% tin and 48% bismuth having a predetermined liquidus temperature which is lower than 183° C. In addition to forming a connection within a microelectronic assembly, these solder pastes may be utilized to form solder joints in other applications. They fulfill the long felt industry need for a solder paste that permits soldering to be completed at a temperature suitable to avoid damage to microelectronic components, that minimizes the time required to melt the solder paste and wet the contact surfaces, and that provides a reliable solder joint for use at higher operating temperatures of modern day microelectronic packages.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, shapes other than spheres can be used for the solder particles, and the entire outer surface of the high temperature nucleus need not be covered with the low temperature solder.

What is claimed is:

1. A solder paste, comprising solder particles dispersed in a flux and a vehicle, the solder particles having a first solder coating surrounding a nucleus of a compositionally distinct second solder, the first solder coating having a melting temperature that is lower than the melting temperature of the second solder.

2. The solder paste as described in claim 1, wherein the first solder coating is an alloy of one or more metals selected from the group consisting of Ag, Bi, Cd, In, Pb, Sb, and Sn.

3. The solder paste as described in claim 2, wherein the first solder coating comprises 43% tin, 43% lead and 14% bismuth.

4. The solder paste as described in claim 2, wherein the first solder coating comprises 52% tin, and 48% bismuth.

5. The solder paste as described in claim 1, wherein the second solder is an alloy of one or more metals selected from the group consisting of Ag, Bi, Cd, In, Pb, Sb, and Sn.

6. The solder paste as described in claim 5, wherein the second solder comprises 62% tin, 36% lead and 2% silver.

7. The solder paste as described in claim 1, wherein the first solder coating comprises about 12% by weight of the solder particle.

8. The solder paste as described in claim 1, wherein the first solder coating comprises about 12% by weight and the nucleus comprises about 88% by weight of the solder particle.

9. A solder paste, comprising:
 a solder powder dispersed in a vehicle, the solder powder comprising:
  a coating of a first solder material on a central core of a second solder material having a solidus temperature, the first solder material compositionally distinct from the second solder material and having a liquidus temperature that is less than the solidus temperature of the second solder material.

10. The solder paste as described in claim 9, wherein the second solder material is a eutectic alloy of tin and lead.

11. The solder paste as described in claim 9, wherein the vehicle further comprises a flux.

12. The solder paste as described in claim 9, wherein the second solder material is an alloy of one or more metals selected from the group consisting of Ag, Bi, Cd, In, Pb, and Sn.

13. The solder paste as described in claim 9, wherein the first solder material is an alloy of one or more metals selected from the group consisting of Ag, Bi, Cd, In, Pb, and Sn.

14. The solder paste as described in claim 9, wherein the second solder material comprises 52% tin, and 48% bismuth.

15. The solder paste as described in claim 9, wherein the first solder material comprises 62% tin, 36% lead and 2% silver.

16. The solder paste as described in claim 9, wherein the coating comprises about 12% by weight of the solder particle.

17. A solder paste, comprising solder particles dispersed in a flux and a vehicle, the solder particles consisting of a coating of a 43% tin, 43% lead and 14% bismuth solder that surrounds a central core of a 62% tin, 36% lead and 2% silver solder.

18. The solder paste as described in claim 17, wherein the coating comprises about 12% by weight of the individual solder particle.

19. The solder paste as described in claim 17, wherein the coating comprises about 12% by weight and the central core comprises about 88% by weight of the individual solder particle.

20. The solder paste as described in claim 1, wherein the first solder coating comprises 43% tin, 43% lead and 14% bismuth, and the second solder comprises 62% tin, 36% lead and 2% silver.

* * * * *